(12) United States Patent
Kubo

(10) Patent No.: US 6,992,007 B2
(45) Date of Patent: Jan. 31, 2006

(54) METHOD OF CLEANING DAMASCENE STRUCTURE OF SEMICONDUCTOR WAFER DURING FABRICATION OF SEMICONDUCTOR DEVICE

(75) Inventor: Akira Kubo, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 187 days.

(21) Appl. No.: 10/417,219

(22) Filed: Apr. 17, 2003

(65) Prior Publication Data
US 2003/0203553 A1 Oct. 30, 2003

(30) Foreign Application Priority Data
Apr. 19, 2002 (JP) .................... 2002-118069

(51) Int. Cl.
*H01L 21/302* (2006.01)

(52) U.S. Cl. .................... 438/689; 156/345.12
(58) Field of Classification Search .............. 438/689
See application file for complete search history.

(56) References Cited

U.S. PATENT DOCUMENTS

| 5,932,027 | A | * | 8/1999 | Mohindra et al. ............ 134/21 |
| 6,458,674 | B1 | * | 10/2002 | Ohashi et al. .............. 438/542 |
| 6,468,362 | B1 | * | 10/2002 | Chen et al. .................. 134/26 |
| 6,494,985 | B1 | * | 12/2002 | Sotozaki et al. ....... 156/345.12 |

FOREIGN PATENT DOCUMENTS

| JP | 04-274324 | 9/1992 |
| JP | 09-237774 | 9/1997 |
| JP | 2000-124179 | 4/2000 |
| JP | 2001-53076 | 2/2001 |
| JP | 2002-97584 | 4/2002 |
| WO | WO 01/99168 | 12/2001 |

* cited by examiner

*Primary Examiner*—David Nelms
*Assistant Examiner*—Thao P. Le
(74) *Attorney, Agent, or Firm*—Young & Thompson

(57) ABSTRACT

A method of cleaning a damascene structure of a semiconductor wafer comprises a process of treating the wafer, which has been polished, using pure water; and subsequently a process of treating the wafer without using pure water.

21 Claims, 6 Drawing Sheets

METHOD OF CLEANING DAMASCENE STRUCTURE OF SEMICONDUCTOR WAFER DURING FABRICATION OF SEMICONDUCTOR DEVICE

BACKGROUND OF THE INVENTION

1. Field of the Invention

The present invention relates to a method of cleaning a damascene structure of a semiconductor wafer during fabrication of a semiconductor device.

2. Description of the Related Art

In current integrated circuits, several layers of interconnect structures fabricated above a substrate containing active devices are often used. Each interconnect layer is fabricated in an interlayer dielectric (ILD). According to the fabrication of metal interconnects by the metal damascene process, vias are etched in each ILD to make contact with conductors In an underlying layer. A layer of conductive material, such as copper (Cu), is deposited, extending above the surface of the ILD. With chemical mechanical polishing (CMP), the metal surface is then polished down to the underlying ILD surface to thereby produce copper plugs.

After the polishing, the wafer is cleaned. A conventional method of cleaning the metal damascene structure is illustrated in FIG. 5.

In step S1 of FIG. 5, the conventional cleaning method begins with removing particles from surfaces of the wafer. After polishing the wafer, particles are removed in a brushing unit. In the brushing unit, a brush is used to carry out a surface cleaning process with chemical solution in the form of ammonia water. In the same brushing unit, pure water is used to carry out a rinsing process.

Subsequently, the cleaning method proceeds to removing metallic impurities from the surfaces of the wafer. In another brushing unit, metallic impurities are removed. In step S2, in the brushing unit, a brush is used to carry out a surface cleaning process with chemical solution in the form of acid solution. In the same brushing unit, pure water is used to carry out a rinsing process.

After removing metallic impurities, the cleaning method proceeds to inhibiting surface corrosion of the wafer in step S3. In a surface corrosion-inhibiting unit, the surfaces of wafer are coated with chemical solution in the form of solution of 1,2,3-benzotriazol (BTA), which is effective to inhibit corrosion of copper (Cu), subsequently, pure water is used to carry out a rinsing process.

Finally, after the surface corrosion prohibiting process, the cleaning method proceeds to drying the wafer. In step S4, the wafer is rinsed with pure water and then tuned to spin in a spin rinse unit. This spinning motion dries the wafer.

FIG. 6 is a top plan view of a copper plug 3 of a metal damascene structure, which has been cleaned by the conventional cleaning method mentioned above. In FIG. 6, the copper plug 3 embedded in via 2 formed through an ILD 1 has dissolved portions 4 extending outwardly in all directions from the surface of the plug 3. The provision of such portions 4 has made the border between the plug 3 and the circular edge of via 2 of the ILD 1 unclear.

It is the inventor's understanding that the above-mentioned abnormal deformation of surface contour of the plug has occurred due to release of electric charge accumulated within the plug due to rinsing with pure water in a drying unit.

Accordingly, a need remains for a method of cleaning a metal damascene structure of a semiconductor wafer without causing the abnormality of surface contour of the plug.

SUMMARY OF THE INVENTION

An object of the present is to provide a method of cleaning a metal damascene structure of a semiconductor wafer without causing the abnormality of surface contour of the plug.

According to one exemplary implementation of the present invention there is provided a method of cleaning a damascene structure of a semiconductor wafer, comprising:

a process of treating the wafer, which has been polished, using pure water; and subsequently a process of treating the wafer without using pure water.

According to another specific exemplary implementation of the present invention, there is provided a method of cleaning a damascene structure of a semiconductor wafer, comprising in the following order:

removing particles from surfaces of the wafer, which has been polished, with chemical solution, and then rinsing the wafer with pure water;

removing metallic impurities from the surfaces of the wafer with chemical solution, and then rinsing the wafer with pure water; and drying the wafer without any rinsing with pure water.

BRIEF DESCRIPTION OF THE DRAWINGS

The present invention will be apparent from the following more particular description of exemplary embodiments of the invention as illustrated in the accompanying drawings. The drawings are not necessarily scale, emphasis instead being placed upon illustrating the principles of the invention.

DESCRIPTION OF THE EXEMPLARY EMBODIMENTS

FIGS. 1 to 4 illustrate exemplary embodiments according to the present invention.

Figure 1:
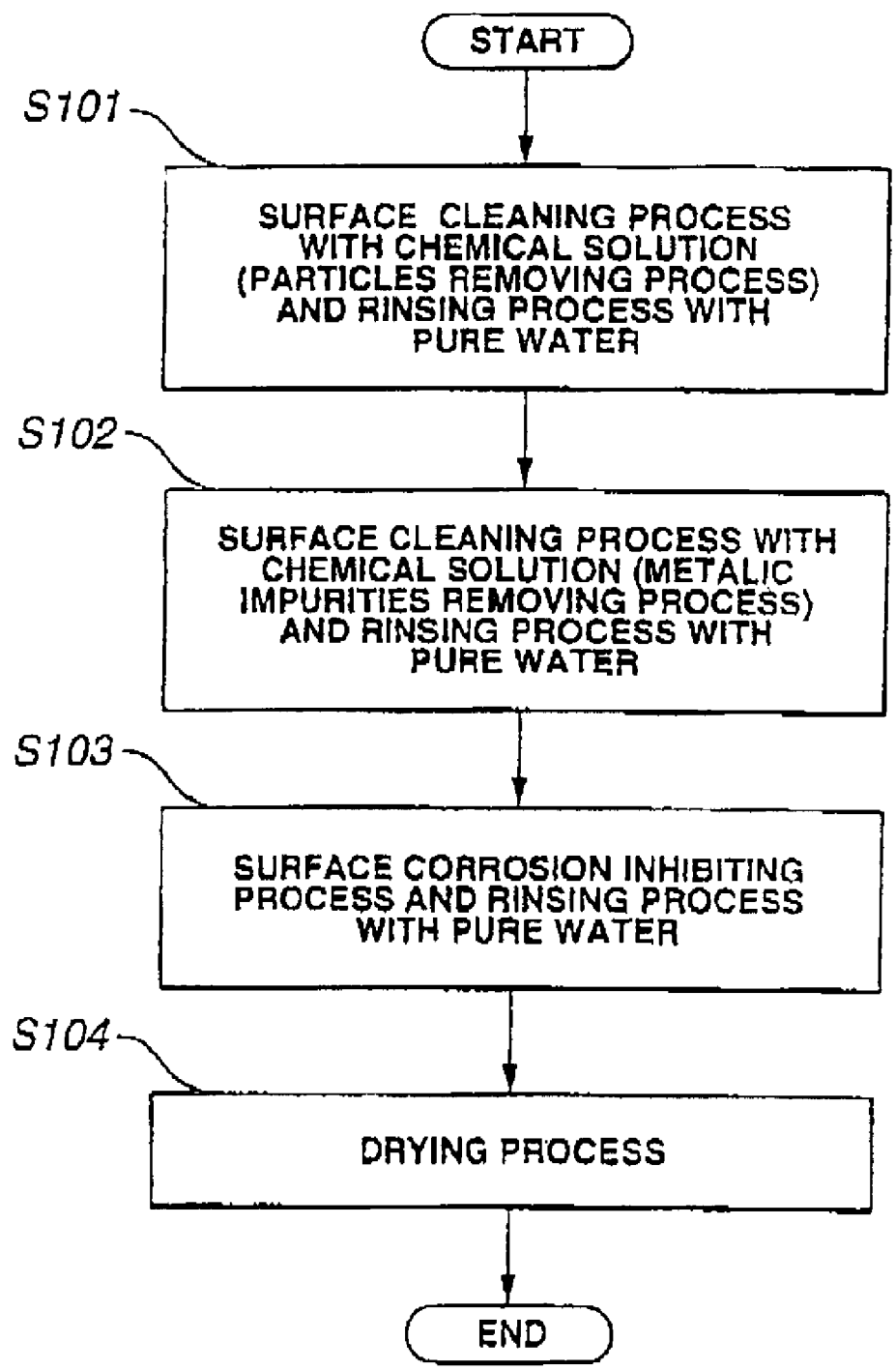
FIG. 1 is a process flow diagram of one embodiment of a method of cleaning a metal damascene structure of a semiconductor wafer according to the present invention.

The process flow diagram in FIG. 1 clearly illustrates one embodiment of a method of cleaning a damascene structure of a semiconductor wafer according to the present invention.

According to the fabrication of metal interconnects by the metal damascene process, vias are formed in an interlayer dielectric (ILD). A layer of conductive material, such as copper (Cu), is deposited, extending above the surface of the ILD. With chemical mechanical polishing (CMP), the metal surface is then polished down to the underlying ILD surface to thereby produce copper plugs. In the embodiment, after polishing, a semiconductor wafer including the damascene structure is cleaned.

In step S101, the cleaning method begins with removing particles from surfaces of the wafer. After polishing the wafer, particles are removed in a brushing unit. In the brushing unit, a brush is used to carry out a surface cleaning process with chemical solution in the form of ammonia water. In the same brushing unit, pure water is used to carry out a rinsing process.

Ammonia water is just an example of chemical solutions that may be used in the surface cleaning process to remove particles. Another example is ammonia electrolytic solution. Still another example is pure water.

Subsequently, the cleaning method proceeds to removing metallic impurities from the surfaces of the wafer from which particles have been removed. In another brushing unit, metallic impurities are removed. In step S102, in the brushing unit, a brush is used to carry out a surface cleaning process with chemical solution in the form of acid solution. In the same brushing unit, pure water is used to carry out a rinsing process.

Figure 2A:
FIGS. 2(a), 2(b), 2(c) and 2(d) illustrate structural formulas of chemical solutions used in the method.
Figure 2B:
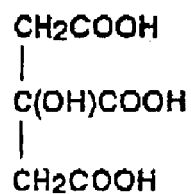

Acid solution is just an example of chemical solutions that may be used in the surface cleaning process to remove metallic impurities. Another example is solution of oxalic acid as shown in FIG. 2(a). Still another example is solution of citric acid as shown in FIG. 2(b). Oxalic acid and citric acid belong to a family of chemical compounds containing COOH group. Solution of any other compound of this family may be used as the chemical solution in the surface cleaning process to remove metallic impurities. Fluorine-containing solution is effective to remove metallic impurities. If desired, one may use fluorine-containing solution for application to the rear surface of the wafer to remove metallic impurities.

After removing metallic impurities, the cleaning method proceeds to inhibiting surface corrosion of the wafer in step S103. In a surface corrosion inhibiting unit, the surfaces of wafer are coated with chemical solution in the form of solution of 1,2,3-benzotriazol (BTA), which is effective to inhibit corrosion of copper (Cu). Subsequently, pure water is used to carry out a rinsing process.

Figure 2C:
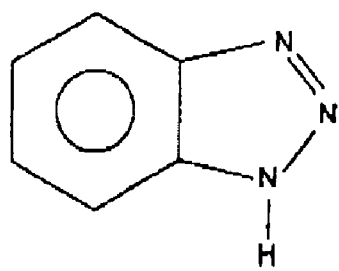
Figure 2D:
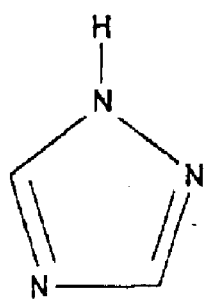

FIG. 2(c) is the structural formula of BTA. BTA is just an example of chemical solutions that may be used in coating the surfaces of wafer. Another example is solution of 1,2,4-triazole whose structural formula is illustrated in FIG. 2(d). BTA and 1,2,4-triazole belong to a family of cyclic compounds. Solution of any other compound of this family may be used as the chemical solution in coating the surfaces of wafer to inhibit surface corrosion.

Finally, after the surface corrosion prohibiting process, the cleaning method proceeds to drying the wafer without any rinsing by pure water. In step S104, the wafer is treated in a drying unit. In the embodiment, the drying unit is in the form of a spin rinse unit, in which the wafer is set to spin. This spinning motion dries the wafer.

According to the embodiment of the present invention, drying the wafer in step S104 does not require any rinsing with pure water. When it is set in the spin rinse unit, the wafer has been rinsed with pure water after the surface coating with chemical solution in the surface corrosion inhibiting process. As different from the conventional cleaning method, the wafer is not rinsed with pure water immediately before it spins.

In the embodiment of the present invention, therefore, rinsing with pure water will not be carried out after the preceding rinsing with pure water. In each of the steps S101, S102 and S103, rinsing with pure water is not allowed except where it is allowed after application to the wafer surfaces of chemical solution while the wafer remains in the same treating unit.

The embodiment according to the present invention does not allow rinsing with pure water to occur successively. Without any application of pure water for rinsing, the wafer is dried due to spinning in the drying unit. Because there is no application of pure water to the wafer in the drying unit, electric charge accumulated within copper plugs is no longer released locally. As a result, the original surface contour of each of copper plugs remains.

It is unlikely that the release of electric charge from a conductive plug occurs when the plug is connected to a line, which is less in width than the diameter of the plug. It is considered that the release of electric charge from a conductive plug occurs when the plug is on a line, which is less in width than the diameter of the plug and connected to another line, which is greater in width than the diameter of the plug. The release of electric charge from a conductive plug occurs when the plug is connected to a line, which is greater in width than the diameter of the plug.

Figure 3:
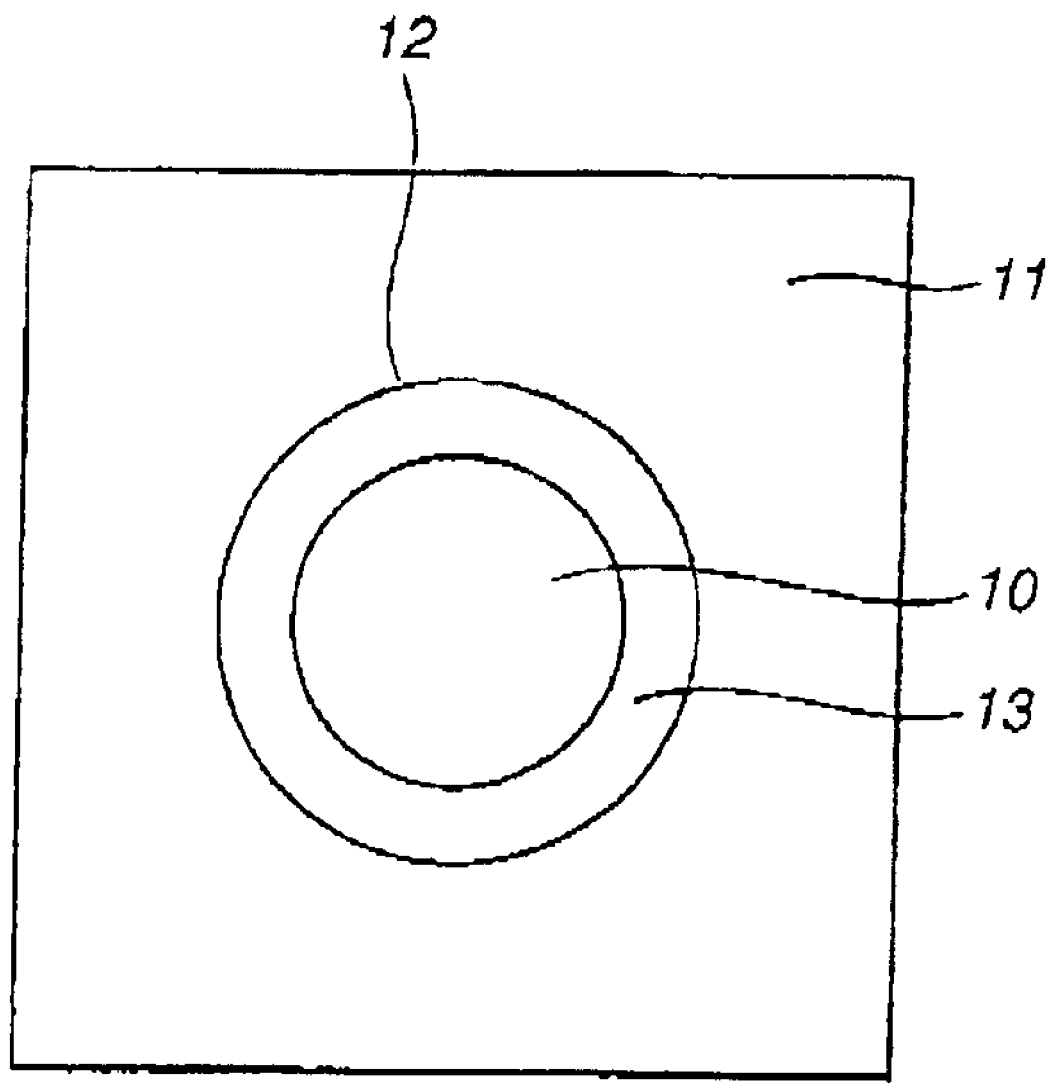
FIG. 3 is a top plan view of a discrete or clear copper (Cu) plug of a metal damascene structure, which has been cleaned according to the present invention.

FIG. 3 is a top plan view of a copper plug 10 of a metal damascene structure, which has been cleaned by the cleaning method according to the embodiment of present invention. In FIG. 3, the copper plug 10 is embedded in via 12 formed through an ILD 11. The reference 13 designates a barrier. FIG. 3 clearly shows the copper plug 10 that is distinct and clear from the ILD 11.

Figure 6:
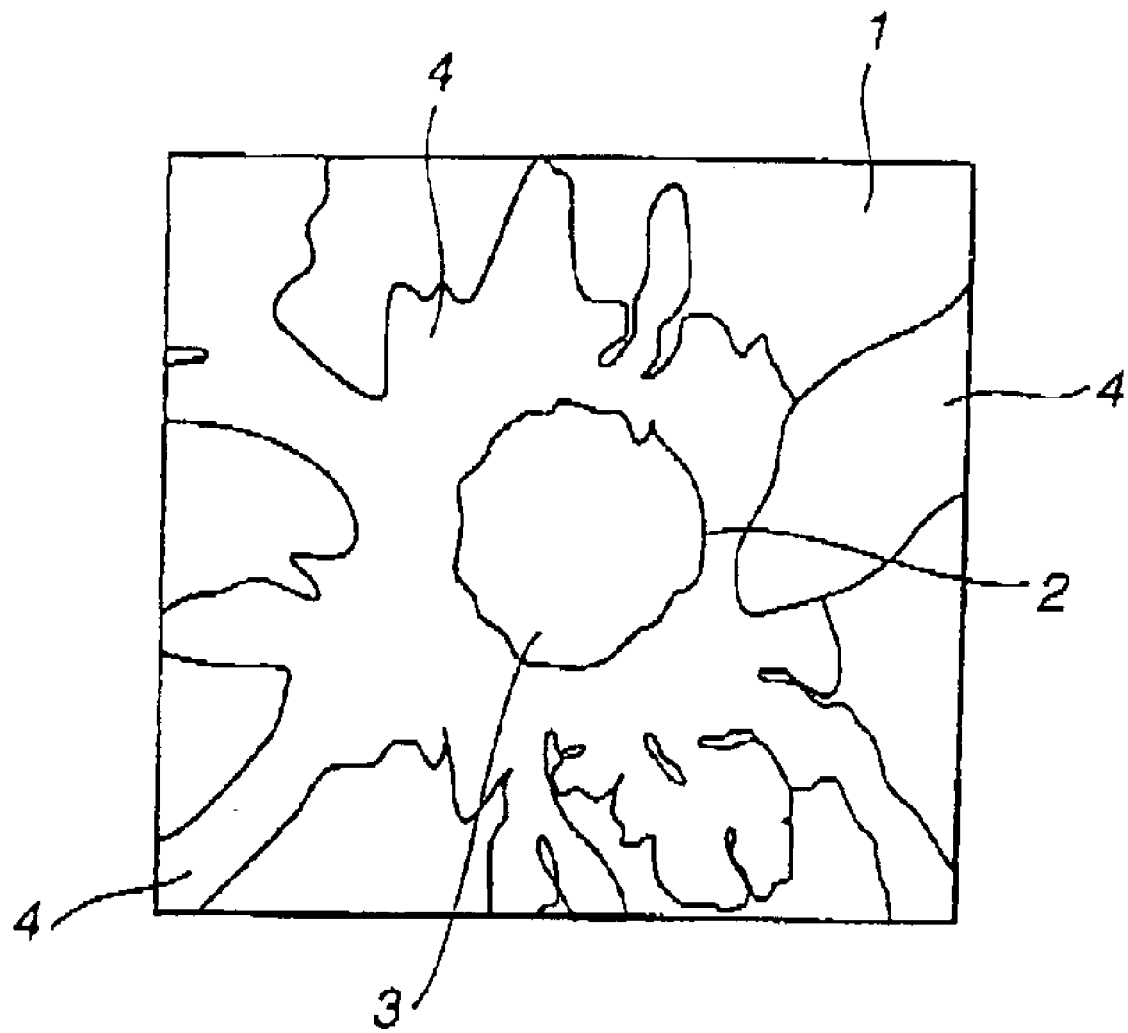
FIG. 6 is a view illustrating a surface of an obscure copper (Cu), which has been cleaned by the conventional method in FIG. 5.

Comparing FIG. 3 with FIG. 6 clearly indicates that there are no dissolved portions of the plug 10 in FIG. 3 so that the boundary between the plug 10 and the surrounding ILD 11 remains distinct and clear.

In the cleaning method, the surface corrosion inhibiting process (step S103) may be removed if the material of plug 10 does not require such treatment.

The cleaning method may include an additional megasonic cleaning to remove particles from surfaces of the wafer. The megasonic cleaning uses ultrasonic wave in the range from 800 kHz to 1 MHz. The megasonic cleaning may be carried out after polishing the wafer and before drying the wafer. It may be carried out immediately before carrying out the particles removing process in step S101 or the metallic impurities removing process in step S102 or the surface corrosion inhibiting process in step S103 or the drying process S104.

Figure 4:
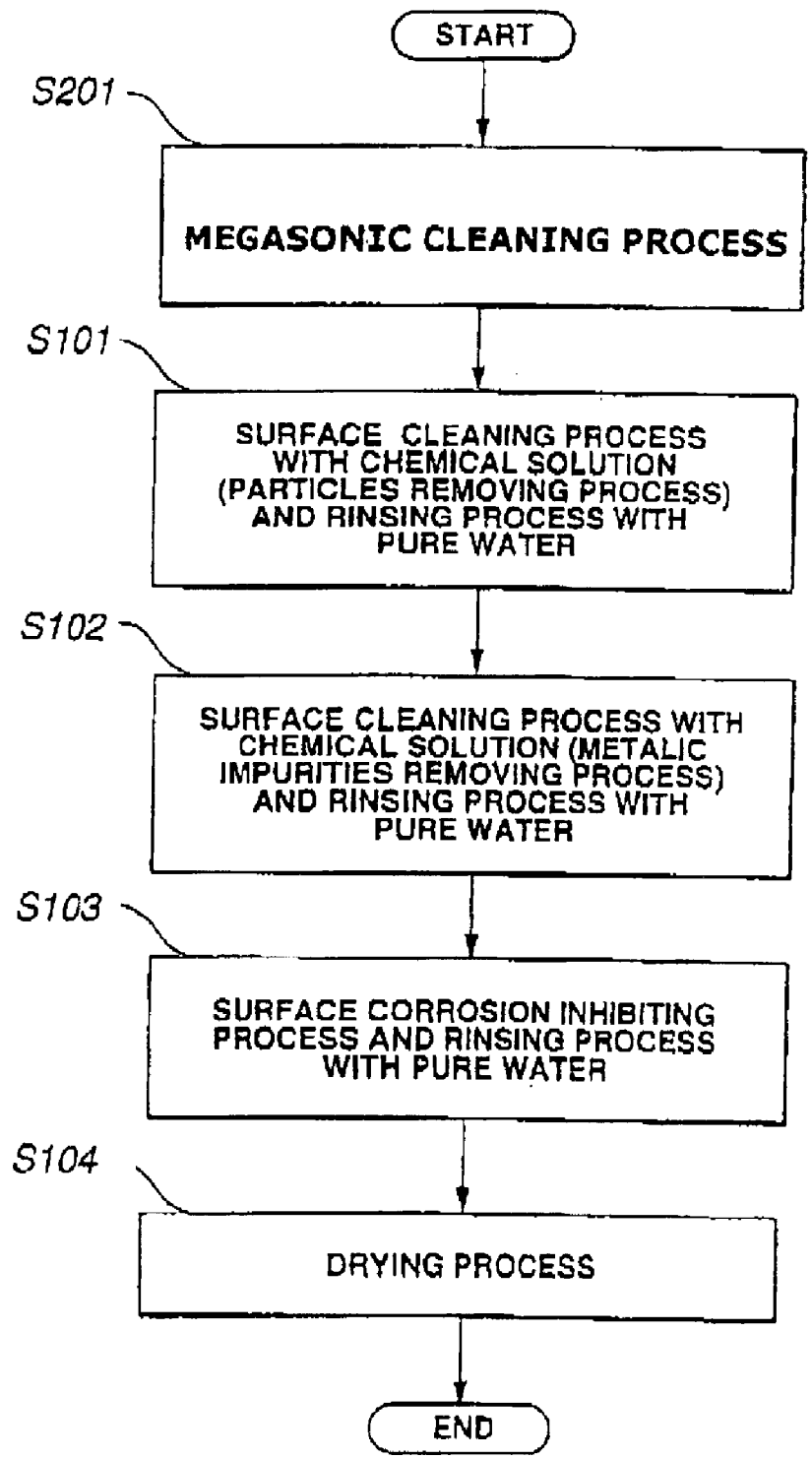
FIG. 4 is a process flow diagram of another embodiment of a method of cleaning a semiconductor wafer for fabrication of a semiconductor device according to the present invention.
Figure 5:
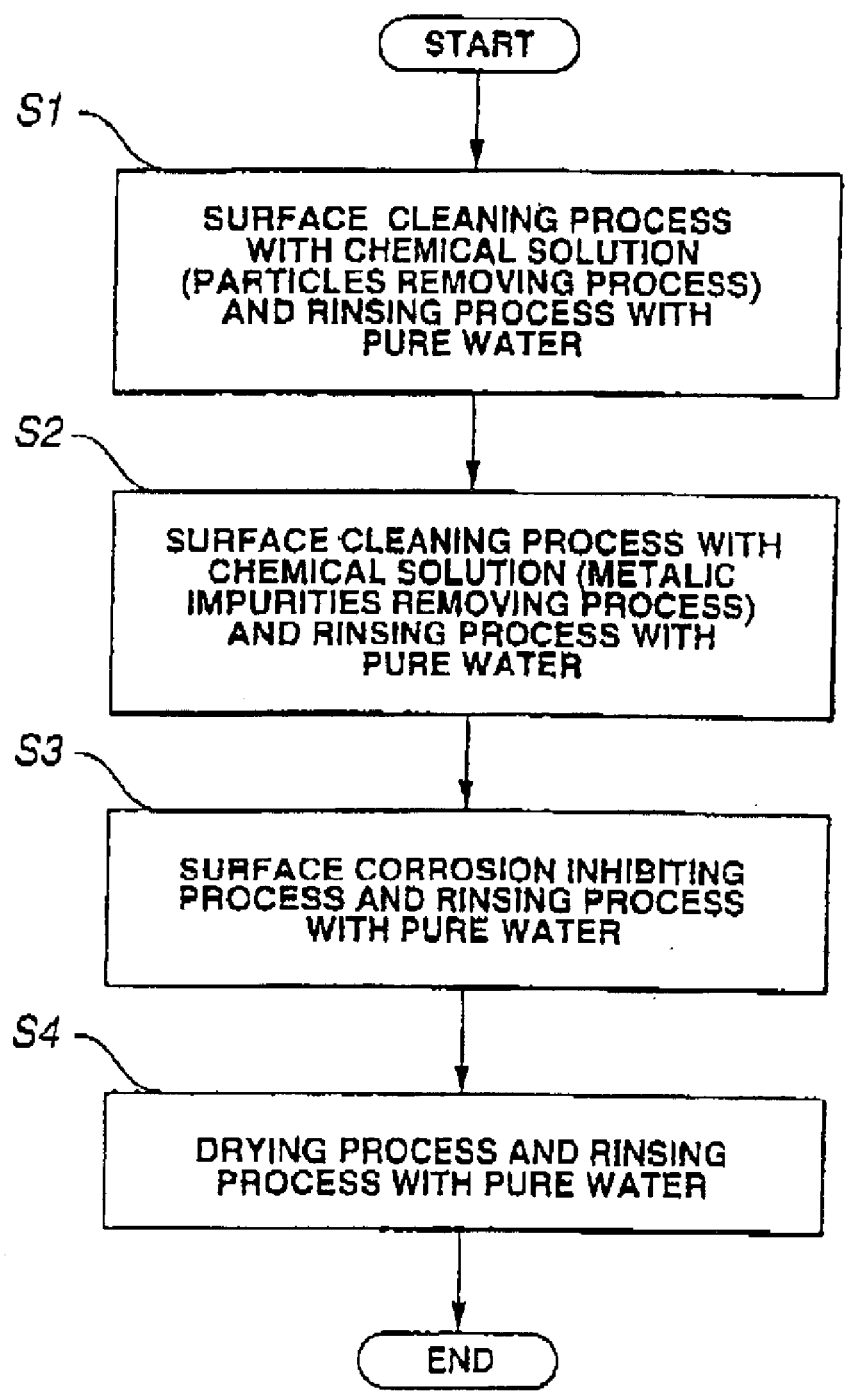
FIG. 5 is a process flow diagram of a conventional method of clearing a metal damascene structure of a semiconductor wafer.

The process flow diagram in FIG. 4 illustrates another embodiment according to the present invention. This embodiment is substantially the same as the previously described embodiment illustrated in FIG. 1 except the provision of megasonic cleaning to remove particles from a wafer after polishing. Thus, the like references are used to designate like steps throughout FIGS. 1 and 4.

According to this embodiment, the cleaning method begins with the megasonic cleaning in step S201. After polishing the wafer, the megasonic cleaning is carried out to remove particles from the wafer.

Subsequently, the cleaning method caries out the same processes in steps S101, S102, S103 and S104 in substantially the same manner as explained in connection with the embodiment illustrated in FIG. 1.

In the embodiments, it is preferred to carry out the rinsing processes by supplying pure water in all directions or spraying pure water in order not to localize electric charge accumulated in the conductive plugs.

In the embodiments, the copper plugs are used as one example of conductive plugs. Another example is a conductive plug of tungsten (W). Other examples are conductive plugs of various alloys of copper (Cu), which includes one metal selected from a group consisting of Al, Ti, Si, Sn, Tn, Zr, Ag and Mg.

While the present invention has been particularly described, in conjunction with exemplary embodiments. It is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Application No. 2002-118069, filed Apr. 19, 2002, the disclosure of which is hereby incorporated by reference in its entirety.

What is claimed is:

1. A method of cleaning a damascene structure of a semiconductor wafer that has been polished, comprising in the following order:
   removing one of particles and metallic impurities from surfaces of the wafer;
   rinsing the surfaces of the wafer with pure water; and
   drying the wafer,
   wherein said drying the wafer step comprises placing the wafer in a drying unit and drying the wafer without any intermediate steps once the wafer is in the drying unit.

2. The method as claimed in claim 1, wherein the removing step includes applying chemical solution to the surfaces of the wafer, and the rinsing step is carried out after the removing step to remove the chemical solution.

3. The method as claimed in claim 2, wherein, in a cleaning unit, the removing step and the rinsing step are carried out.

4. A method of cleaning a damascene structure of a semiconductor wafer that has been polished, comprising in the following order the steps of:
   removing particles from surfaces of the wafer with a first chemical solution;
   rinsing the wafer with pure water;
   removing metallic impurities from the surfaces of the wafer with a second chemical solution;
   rinsing the wafer with pure water; and
   drying the wafer,
   wherein said drying the wafer step comprises placing the wafer in a drying unit and drying the wafer without any intermediate steps once the wafer is in the drying unit.

5. The method as claimed in claim 4, wherein the step of removing particles from surfaces of the wafer includes a step of megasonic cleaning to remove particles from surfaces of the wafer.

6. The method as claimed in claim 4, further comprising:
   a step of inhibiting surface corrosion of the wafer with a third chemical solution after the step of rinsing the wafer with pure water and before the step of drying the wafer.

7. The method as claimed in claim 4, wherein the first chemical solution is one of ammonia water, ammonia electrolytic solution, and pure water.

8. The method as claimed in claim 4, wherein the second chemical solution is one selected from a group consisting of acid solution, solution of oxalic acid, solution of citric acid, and solution of any one of other compounds of a family of chemical compounds containing COOH group.

9. The method as claimed in claim 6, wherein the third chemical solution is one selected from a group consisting of solution of 1,2,3-benzotriazol (BTA), solution of 1,2,4-triazole, and solution of any one of other compounds of a family cyclic compounds.

10. The method as claimed in claim 4, wherein a conductive plug of the damascene structure is made of a conductive material, which is one selected from a group consisting of copper (Cu), tungsten (W), and alloy of Cu containing one of Al, Ti, Si, Sn, Tn, Zr, Ag and Mg.

11. The method as claimed in claim 5, further comprising:
   a step of inhibiting surface corrosion of the wafer with a third chemical solution, after the step of rinsing the wafer with pure water and before the step of drying the wafer.

12. The method as claimed in claim 5, wherein the first chemical solution is one of ammonia water, ammonia electrolytic solution, and pure water.

13. The method as claimed in claim 6, wherein the first chemical solution is one of ammonia water, ammonia electrolytic solution, and pure water.

14. The method as claimed in claim 5, wherein the second chemical solution is one selected from a group consisting of acid solution, solution of oxalic acid, solution of citric acid, and solution of any one of other compounds of a family of chemical compounds containing COOH group.

15. The method as claimed in claim 6, wherein the second chemical solution is one selected from a group consisting of acid solution, solution of oxalic acid, solution of citric acid, and solution of any one of other compounds of a family of chemical compounds containing COOH group.

16. A method of cleaning a damascene structure of a semiconductor wafer, comprising in the following order the steps of:
   placing the wafer in a cleaning unit;
   removing particles from surfaces of the wafer using a first chemical solution and then rinsing the wafer with pure water;
   removing metallic impurities from the surfaces of the wafer using a second chemical solution different from the first chemical solution and then rinsing the wafer using pure water;
   placing the wafer in a surface corrosion inhibiting unit;
   coating the surfaces of the wafer with a third chemical solution that is different from the first and second chemical solutions and then rinsing the wafer with pure water;
   placing the wafer in a drying unit; and
   immediately drying the wafer without any intermediate steps once the wafer is placed in the drying unit.

17. The method as claimed in claim 16, further comprising:
   megasonic cleaning to remove particles from surfaces of the wafer, which has been polished.

18. The method as claimed in claim 17, wherein said megasonic cleaning uses ultrasonic waves in a range from 800 kHz to 1 MHz.

19. The method as claimed in claim 1, wherein the any intermediate steps include rinsing the wafer.

20. The method as claimed in claim 4, wherein the any intermediate steps include rinsing the wafer.

21. The method as claimed in claim 16, wherein the any intermediate steps include rinsing the wafer.

* * * * *